United States Patent
Choi et al.

(10) Patent No.: US 7,349,282 B2
(45) Date of Patent: Mar. 25, 2008

(54) POWER VOLTAGE SUPPLIER OF SEMICONDUCTOR MEMORY DEVICE

(75) Inventors: Jun-Gi Choi, Ichon-shi (KR); Yong-Kyu Kim, Ichon-shi (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 94 days.

(21) Appl. No.: 11/020,244

(22) Filed: Dec. 27, 2004

(65) Prior Publication Data

US 2006/0050589 A1    Mar. 9, 2006

(30) Foreign Application Priority Data

Sep. 6, 2004    (KR)    ............ 10-2004-0070846

(51) Int. Cl.
    *G11C 7/00*    (2006.01)
(52) U.S. Cl. ............... 365/226; 365/149; 365/205
(58) Field of Classification Search ............ 365/226, 365/149, 205
    See application file for complete search history.

(56) References Cited

U.S. PATENT DOCUMENTS

| | | | |
|---|---|---|---|
| 4,578,772 A * | 3/1986 | Fujii ............ | 708/844 |
| 5,596,539 A | 1/1997 | Passow et al. | |
| 5,680,300 A * | 10/1997 | Szepesi et al. ......... | 363/59 |
| 5,751,643 A * | 5/1998 | Lines ............ | 365/189.11 |
| 6,055,201 A * | 4/2000 | Foss et al. ......... | 365/226 |
| 6,208,575 B1 | 3/2001 | Proebsting | |
| 6,434,076 B1 * | 8/2002 | Andersen et al. ......... | 365/222 |
| 6,445,623 B1 * | 9/2002 | Zhang et al. ......... | 365/189.11 |
| 6,501,693 B2 | 12/2002 | Takatsuka et al. | |
| 6,618,296 B2 * | 9/2003 | Zhang ............ | 365/189.09 |
| 6,794,923 B2 * | 9/2004 | Burt et al. ......... | 327/382 |
| 6,822,884 B1 * | 11/2004 | Rosenthal et al. ......... | 363/59 |

FOREIGN PATENT DOCUMENTS

JP    02-308495    12/1990

* cited by examiner

*Primary Examiner*—David Lam
(74) *Attorney, Agent, or Firm*—McDermott Will & Emery LLP

(57) ABSTRACT

The present invention provides a power voltage supplier for stably supplying a noise-free power voltage without increasing a size of a reservoir capacitor by employing a sharing scheme of the reservoir capacitor. The power voltage supplier of a semiconductor memory device includes: a first power voltage supply line for supplying a first power voltage; a second power voltage supply line for supplying a second power voltage; a first reservoir capacitor for supplying the first and the second power voltages stably; and a reservoir capacitor controller for selectively connecting the first reservoir capacitor to the first power voltage supply line or the second power voltage supply line.

21 Claims, 5 Drawing Sheets

POWER VOLTAGE SUPPLIER OF SEMICONDUCTOR MEMORY DEVICE

FIELD OF INVENTION

The present invention relates to a semiconductor memory device; and, more particularly, to a power voltage supplier of the semiconductor memory device capable of stably supplying a noise-free power voltage to drive the semiconductor memory device.

DESCRIPTION OF PRIOR ART

In recent years, a dynamic random access memory (DRAM) device requires a high-speed and a low operational voltage for its operation. In particular, since a threshold voltage variance of a transistor and its magnitude are key factors to determine a stability of a circuit in a low-voltage semiconductor memory device, it is necessary to stabilize a voltage source for supplying a power voltage.

Therefore, in order to stabilize the power voltage, a power voltage supplier of the semiconductor memory device includes generally a power voltage generator for generating a power voltage of a desired voltage level after receiving an external power voltage and a reservoir capacitor connected to an output node of the power voltage generator for keeping the voltage level of the power voltage stable without noise.

FIG. 1 is a block diagram setting forth a prior art semiconductor memory device incorporating therein a power voltage supplier.

Referring to FIG. 1, the prior art semiconductor memory device includes a memory cell array 10 having a plurality of memory cells, a bit line sense amplifier (BLSA) array 20 having a plurality of bit line sense amplifiers, a VPP voltage supplier 30 for supplying a VPP voltage, a word line driver 40, a VDD voltage supplier 50 for supplying a VDD voltage, a VCORE voltage supplier 60 for supplying a VCORE voltage, a BLSA driving control signal generator 70, an overdriving control signal generator 80 and a BLSA driver 90. The VPP voltage is higher than the VDD voltage and the VCORE voltage is lower than the VDD voltage, wherein the VDD voltage is applied from an exterior voltage source.

Herein, the BLSA array 20 senses a potential difference of the bit line pair BL and /BL and amplifies a voltage level of a bit line pair BL and /BL of the memory cell array 10. The word line driver 40 drives a word line WL of the memory cell array 10 arranged in a same row with the VPP voltage in response to an active command signal ACT, to thereby activate the memory cells corresponding to the word line WL. The BLSA driving control signal generator 70 generates a BLSA driving control signal SA_ACT in response to the active command signal ACT. The overdriving control signal generator 80 generates an overdriving control signal by receiving the BLSA driving control signal SA_ACT.

The BLSA driver 90 generates a driving voltage signal RTO for driving the bit line sense amplifier with the VCORE voltage by receiving the BLSA driving control signal SA_ACT. In particular, the BLSA driver 90 is used for overdriving the bit line sense amplifier with the VDD voltage at an initial operation stage, in response to the overdriving control signal outputted from the overdriving control signal generator 80. Though it is not shown in the drawing, the voltage suppliers 30, 50 and 60 include a respective reservoir capacitor at an output node thereof, for stabilizing an output voltage level from noise.

FIG. 2 is a timing diagram setting forth an operation of the prior art semiconductor memory device.

To begin with, the word line driver 40 applies the VPP voltage to the word line WL of the memory cell array 10 in response to the active command signal ACT so that a data of the memory cell connected to the word line is applied to the bit line BL as a micro-voltage. Such an operational period is denoted as A in FIG. 2. The BLSA driving control signal generator 70 activates the BLSA driving control signal SA_ACT after a first predetermined time in response to the active command signal ACT. The overdriving control signal generator 80 activates the overdriving control signal after a second predetermined time passes from an activation point of the BLSA driving control signal SA_ACT. The BLSA driver 90 drives the bit line sense amplifier with the VCORE voltage in response to the BLSA driving control signal SA_ACT and particularly overdrives the bit line sense amplifier with the VDD voltage at the initial operation stage when the overdriving control signal is activated. Therefore, the bit line sense amplifier senses and amplifies a data voltage applied to the bit line BL.

Thereafter, when a precharge command PCG is inputted, the word line WL is deactivated and the bit line pair BL and /BL is precharged to a predetermined voltage level VBLP, of which an operational period is denoted as C in FIG. 2. Herein, a period denoted B in FIG. 2 is a period that the VDD voltage is applied for overdriving the bit line sense amplifier by means of the overdriving control signal.

As described above, the prior art semiconductor memory device uses the VPP voltage for activating a predetermined word line after receiving the active command signal ACT. In addition, the VDD voltage is supplied to the bit line sense amplifier instead of the VCORE voltage at the initial operation stage of the bit line sense amplifier so that a plurality of charges are applied to the reservoir capacitor. Thus, it is possible to raise the voltage level applied to the bit line BL so as to enhance a RAS to CAS delay time (tRCD) and a write recovery time (tWR). Herein, the tRCD is a time difference between an input timing of a row address and an input timing of a column address. The tWR is a minimum time required for stably storing the data into the unit cell not being prevented by the precharge operation.

Meanwhile, since a plurality of memory cells, e.g., thousands of memory cells, connected to the same word line, the data of the bit line applied by the activated word line are simultaneously sensed and amplified at the bit line sense amplifiers so that the VDD voltage is consumed very much during sensing and amplification. As a result, there is happened a VDD voltage drop.

Therefore, in order to stabilize the voltage level of the VDD voltage at the initial operation stage of the bit line sense amplifier, there has been introduced a method of increasing a size of the reservoir capacitor in the VDD voltage supplier. However, in case of increasing the reservoir capacitor size on the basis of the case that maximum VDD voltage is consumed, a cell area should be inevitably increased so that it is difficult to fabricate the highly integrated memory device with a micronized scale. Thus, to address the above problem, it is necessary to develop new power voltage supplier for use in the semiconductor memory device which is adaptive for stably supplying the power voltage without increasing the cell area.

SUMMARY OF INVENTION

It is, therefore, an object of the present invention to provide a power voltage supplier for stably supplying a noise-free power voltage without increasing a size of a reservoir capacitor.

It is, therefore, another object of the present invention to provide a semiconductor memory device incorporating therein a power voltage supplier for stably supplying a noise-free power voltage without increasing a size of a reservoir capacitor.

In accordance with an aspect of the present invention, there is provided a power voltage supplier of a semiconductor memory device, including: a first power voltage supply line for supplying a first power voltage; a second power voltage supply line for supplying a second power voltage; a first reservoir capacitor for supplying the first and the second power voltages stably; and a reservoir capacitor controller for selectively connecting the first reservoir capacitor to the first power voltage supply line or the second power voltage supply line.

In accordance with another aspect of the present invention, there is provided a semiconductor memory device incorporating therein a power voltage supplier, including: a bit line sense amplifier (BLSA) array provided with a plurality of bit line sense amplifiers for sensing and amplifying data of bit lines; a power voltage supply means including a first, a second and a third power voltage suppliers for supplying a first, a second and a third power voltages, respectively; a BLSA driving control signal generation means for generating a pre-driving control signal and a BLSA driving control signal, after receiving an active command; a reservoir capacitor control means for selectively connecting a reservoir capacitor to the first power voltage supplier or the second power voltage supplier; an overdriving control signal generator for receiving the BLSA driving control signal to generate an overdriving control signal; and a BLSA driver for driving the bit line sense amplifier with the third power voltage during a first predetermined time and for overdriving the bit line sense amplifier with the first power voltage during a second predetermined time.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a semiconductor memory device incorporating therein a power voltage supplier in accordance with the present invention will be described in detail referring to the accompanying drawings.

Figure 1:
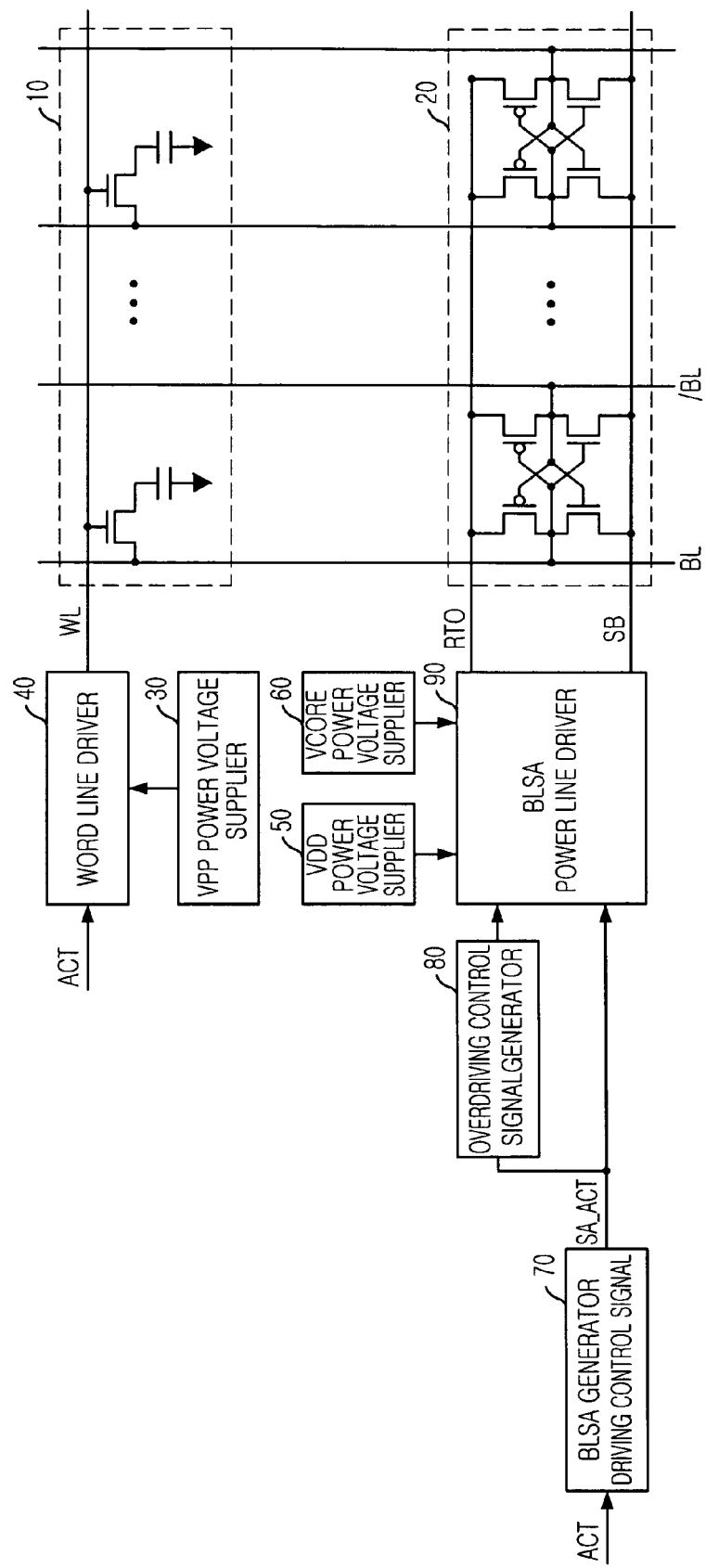
FIG. 1 is a block diagram setting forth a prior art semiconductor memory device incorporating therein a power voltage supplier.
Figure 2:
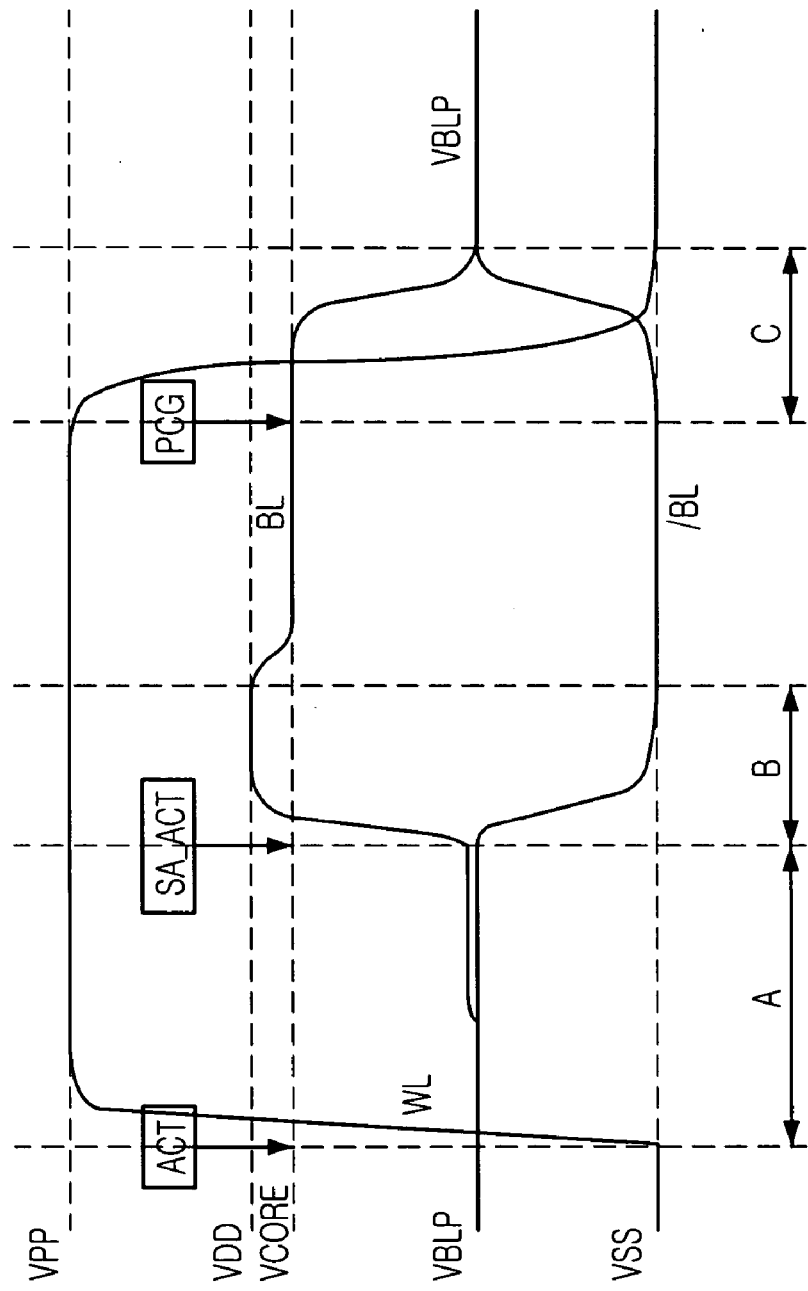
FIG. 2 is a timing diagram setting forth an operation of the prior art semiconductor memory device.
Figure 3:
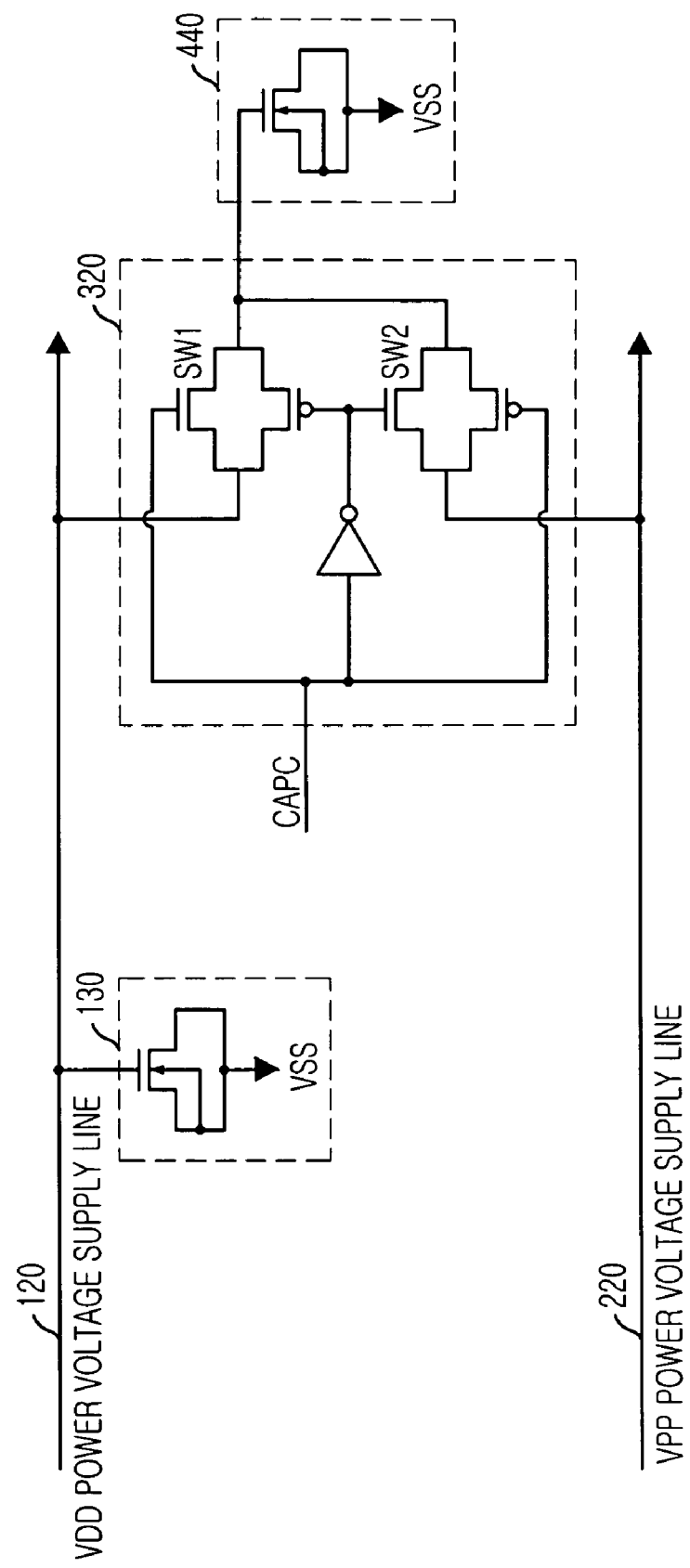
FIG. 3 is a circuit diagram setting forth a semiconductor memory device with a power voltage supplier in accordance with a preferred embodiment of the present invention.

FIG. 3 is a circuit diagram setting forth a power voltage supplier where a reservoir capacitor is shared between a VPP voltage supplier and a VDD voltage supplier in accordance with a preferred embodiment of the present invention.

Referring to FIG. 3, the power voltage supplier of the present invention includes a VDD voltage supply line 120 for supplying a VDD voltage, a first reservoir capacitor 130 connected to the VDD voltage line 120 for stabilizing a voltage level, a VPP voltage supply line 220 for supplying a VPP voltage, a second reservoir capacitor 440 selectively connected to the VDD voltage supply line 120 and the VPP voltage supply line 220, and a reservoir capacitor controller 320. Herein, the reservoir capacitor controller 320 connects the second reservoir capacitor 440 to the VDD voltage supply line 120 while the VDD voltage is consumed without consumption of the VPP voltage or connects the second reservoir capacitor 440 to the VPP voltage supply line 220 while the VPP voltage is much consumed in such a case that the word line WL is turned on/off.

The reservoir capacitor controller 320 is provided with a first switch SW1 and a second switch SW2, wherein the first switch SW1 connects the second reservoir capacitor 440 to the VDD voltage supply line 120 in response to a control signal CAPC which is activated when the VDD voltage is consumed without consumption of the VPP voltage, and the second switch SW2 connects the second reservoir capacitor 440 to the VPP voltage line 220 in response to the control signal CAPC.

In detail, when the control signal CAPC becomes in logic low level, the second reservoir capacitor 440 is connected to the VPP voltage supply line 220. On the contrary, when the control signal CAPC becomes in logic high level, the second reservoir capacitor 440 is connected to the VDD voltage supply line 120. Therefore, the first and the second reservoir capacitors 130 and 440 are connected to the VDD voltage line 120 while the control signal CAPAC is in logic high level so that it is possible to supply the VDD voltage stably in comparison with the prior art.

That is, in case that specific operational periods that consume the VDD power voltage and the VPP power voltage are not overlapped each other, the inventive power voltage supplier employs such a sharing scheme that the second reservoir capacitor 440 is selectively connected to the VDD voltage supply line 120 and the VPP voltage supply line 220 according to an activation state of the control signal CAPC. As a result, it is possible to supply the VDD power voltage having a stable voltage level in a virtue of the second reservoir capacitor 440 without further increasing a size of the first reservoir capacitor connected to the VDD voltage supply line 120.

Figure 4:
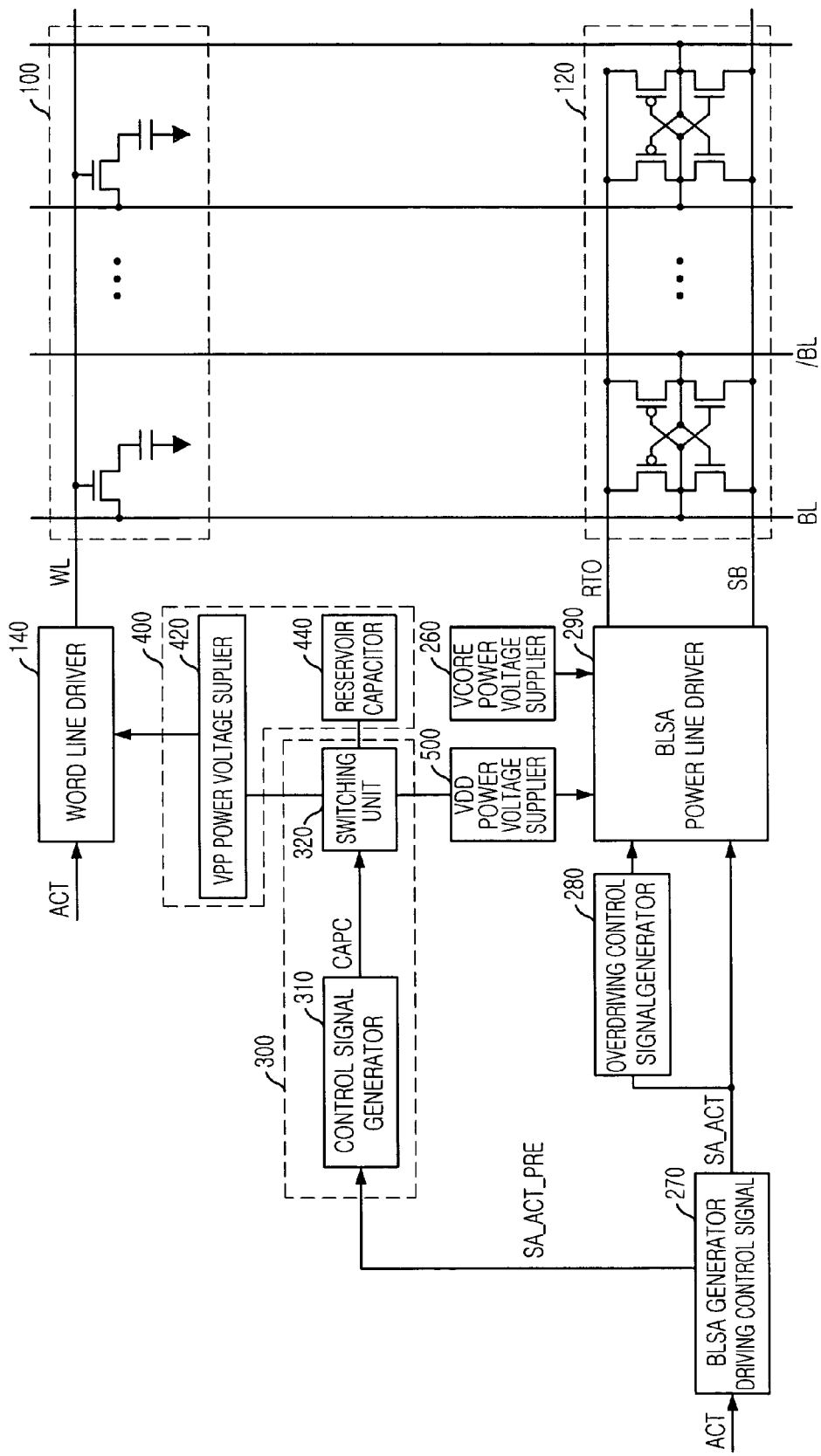
FIG. 4 is a block diagram setting forth the power supplier of the semiconductor memory device in accordance with the preferred embodiment of the present invention.

FIG. 4 is a block diagram setting forth the semiconductor memory device having the power voltage supplier in accordance with the preferred embodiment of the present invention.

Referring to FIG. 4, the inventive semiconductor memory device with the power voltage supplier includes a memory cell array 100 having a plurality of memory cells, a bit line sense amplifier (BLSA) array 120 having a plurality of bit line sense amplifiers, a VPP voltage supplier 400 provided with a VPP voltage generator 420 and a reservoir capacitor 440 for supplying a VPP voltage, a word line driver 140, a VDD power voltage supplier 500 for supplying a VDD voltage, a VCORE voltage supplier 260 for supplying a VCORE voltage, a BLSA driving control signal generator 270, a reservoir capacitor controller 300, an overdriving control signal generator 280 and a BLSA driver 290.

Herein, the BLSA array 120 senses a potential difference of the bit line pair BL and /BL and amplifies a voltage level of a bit line pair BL and /BL of the memory cell array 100.

The word line driver 140 drives a word line WL of the memory cell array 100 arranged in a same row with the VPP voltage in response to an active command signal ACT, to thereby activate the memory cells corresponding to the word line WL. The BLSA driving control signal generator 270 receives the active command signal ACT and generates a pre-driving control signal SA_ACT_PRE and a BLSA driving control signal SA_ACT. The reservoir capacitor controller 300 selectively connects the reservoir capacitor 440 to an output node of the VPP voltage generator 420 or an output node of the VDD voltage supplier 500 after receiving the pre-driving control signal SA_ACT_PRE. The overdriving control signal receives the driving control signal SA_ACT and thus, generates an overdriving control signal. The BLSA driver 290 generates a driving voltage signal RTO for driving the bit line sense amplifier with the VCORE voltage by receiving the BLSA driving control signal SA_ACT, and particularly overdrives the bit line sense amplifier with the VDD voltage at an initial operation stage, in response to the overdriving control signal.

The reservoir capacitor controller 300 is provided with a control signal generator 310 and a switching unit 320. The control signal generator 310 generates and activates a control signal CAPC in response to the pre-driving control signal SA_ACT_PRE, wherein an activation period B of the overdriving control signal exists within an activation period D of the control signal CAPC. The switching unit 320 connects the reservoir capacitor 440 selectively to the output node of the VPP voltage generator 420 or the output node of the VDD voltage generator 500. As shown in FIG. 3, the switching unit 320 is provided with the first switch and the second switch for selectively connecting the reservoir capacitor to the VDD voltage supplier 500 or the VPP voltage supplier 420.

Figure 5:
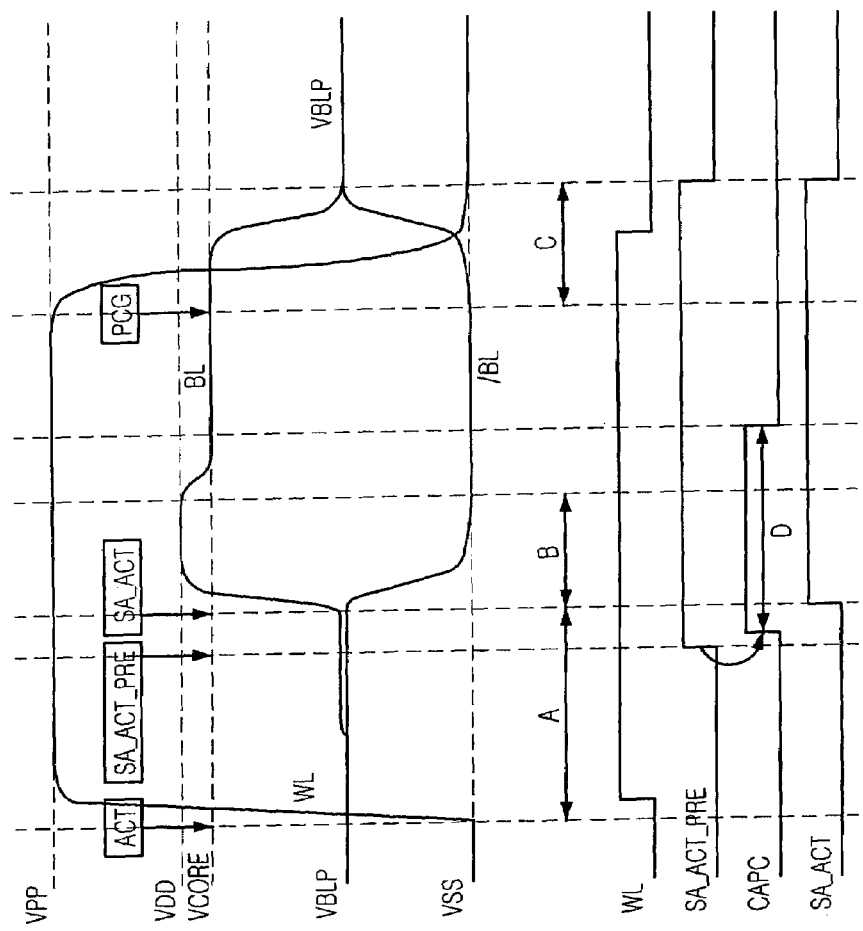
FIG. 5 is a timing diagram setting forth an operation of the semiconductor memory device in accordance with the preferred embodiment of the present invention.

FIG. 5 is a timing diagram setting forth an operation of the semiconductor memory device in accordance with the preferred embodiment of the present invention.

To begin with, the word line driver 140 applies the VPP voltage to the word line in response to the active command ACT so that the data of the memory cell connected to the word line WL is applied to the bit line. Such an operational period is denoted as A in FIG. 5. In addition, the BLSA driving control signal generator 270 activates the pre-driving control signal SA_ACT_PRE, and then activates the BLSA driving control signal SA_ACT in response to the active command signal ACT after a predetermined time is passed from an activation point of the pre-driving control signal SA_ACT_PRE.

Afterwards, the BLSA driver 290 drives the bit line sense amplifier with the VCORE voltage in response to the BLSA driving control signal SA_ACT, and particularly overdrives the bit line sense amplifier with the VDD voltage at the initial operation stage while the overdriving control signal is activated. At this time, since the control signal generator 310 activates the control signal CAPC in response to the activated pre-driving control signal SA_ACT_PRE and then maintains an active state for the activation period D, the reservoir capacitor 440 is connected to the output node of the VDD voltage supplier 500 within the activation period D of the control signal CAPC.

Thereafter, when a precharge signal PCG is applied to deactivate the word line, the bit line pair BL and /BL is precharged to a precharge voltage level VBLP, which is denoted as C in FIG. 5.

The inventive semiconductor memory device connects the reservoir capacitor 440 to the output node of the VDD voltage supplier 500 during the activation period D of the control signal CAPC so that it is possible to prevent the voltage level of the VDD voltage from being dropped due to a lot of current consumption at the initial operation stage of the bit line sense amplifier. In addition, the reservoir capacitor 440 is connected to the output node of the VPP voltage generator 420 when the control signal CAPC is deactivated so as to prepare a precharge operation in which the VPP voltage is much consumed.

As described above, in accordance with the power voltage supplier of the present invention, the reservoir capacitor of the VPP voltage supplier is shared with the VDD voltage supplier, which is controlled by the control signal CAPC. That is, since the VPP voltage level is unstable in case of consuming the VPP voltage substantially, e.g., in case of the word line being turned on/off, it is difficult to implement the sharing scheme of the reservoir capacitor during these cases. Except these cases, meanwhile, as the VPP voltage level is not unstable, e.g., in the operational period of the bit line sense amplifier, it is possible to employ the sharing scheme of the reservoir capacitor between the VDD voltage supplier and the VPP voltage supplier.

Accordingly, it is possible to maintain the voltage level of the VDD voltage without noise while the bit line sense amplifier performs a sensing and an amplifying operation and thus, to achieve the semiconductor memory device operable with high reliability.

Meanwhile, though the reservoir capacitor of the VPP voltage supplier is shared with the VDD voltage supplier in the preferred embodiment because the operational periods utilizing the VDD voltage and the VPP voltage are not overlapped each other, the inventive sharing scheme of the reservoir capacitor can be applied to the other power voltage suppliers where specific operational periods are not overlapped each other.

The present application contains subject matter related to the Korean patent application No. KR 2004-70846, filled in the Korean Patent Office on Sep. 6, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A power voltage supplier of a semiconductor memory device, comprising:
   a first power voltage supply line for supplying a first power voltage;
   a second power voltage supply line for supplying a second power voltage;
   a first reservoir capacitor for supplying the first and the second power voltages stably; and
   a reservoir capacitor controller for selectively connecting the first reservoir capacitor either to the first power voltage supply line or the second power voltage supply line,
   wherein the reservoir capacitor controller includes:
   a control signal generator for generating a predetermined control signal; and
   a switching unit for selectively connecting the first reservoir capacitor to the first power voltage line or the second power voltage line in response to the predetermined control signal,
   wherein the switching unit includes:
   a first switch for connecting the first reservoir capacitor to the first power voltage supply line when the predetermined control signal is activated; and a second switch for connecting the first reservoir capacitor to the second power voltage line when the predetermined control signal is deactivated.

2. The power voltage supplier as recited in claim 1, wherein the reservoir capacitor controller connects the first reservoir capacitor to the first power voltage supply line when the first power voltage is consumed without the second power voltage being consumed, or connects the first reservoir capacitor to the second power voltage supply line when the second power voltage is consumed.

3. The power voltage supplier as recited in claim 1, wherein the reservoir capacitor controller further includes an inverter for inverting the predetermined control signal.

4. The power voltage supplier as recited in claim 1, wherein the first voltage is lower than the second voltage.

5. The power voltage supplier as recited in claim 4, wherein the first voltage is a VDD voltage and the second voltage is a VPP voltage.

6. The power voltage supplier as recited in claim, 1, further comprising a second reservoir capacitor for maintaining a voltage level of the first power voltage stably, which is connected to the first power voltage supply line.

7. A semiconductor memory device incorporating therein a power voltage supplier, comprising:
a bit line sense amplifier (BLSA) array provided with a plurality of bit line sense amplifiers for sensing and amplifying data of bit lines;
a power voltage supply means including a first, a second and a third power voltage suppliers for supplying a first, a second and a third power voltages, respectively;
a BLSA driving control signal generation means for generating a pre-driving control signal and a BLSA driving control signal, after receiving an active command;
a reservoir capacitor control means for selectively connecting a reservoir capacitor to the first power voltage supplier or the second power voltage supplier;
an overdriving control signal generator for receiving the BLSA driving control signal to generate an overdriving control signal; and
a BLSA driver for driving the bit line sense amplifier with the third power voltage during a first predetermined time and for overdriving the bit line sense amplifier with the first power voltage during a second predetermined time.

8. The semiconductor memory device as recited in claim 7, wherein the reservoir capacitor is connected to an output node of the second power voltage supplier and is shared with the first power voltage supplier.

9. The semiconductor memory device as recited in claim 7, further comprising a word line driver for driving a word line with the second power voltage.

10. The semiconductor memory device as recited in claim 7, wherein the first voltage, the second voltage and the third voltage is a VDD voltage, a VPP voltage and a VCORE voltage, respectively.

11. The semiconductor memory device as recited in claim 7, wherein the reservoir capacitor controller connects the reservoir capacitor to the first power voltage supply line when the first power voltage is consumed without the second power voltage being consumed, or connects the reservoir capacitor to the second power voltage supply line when the second power voltage is consumed.

12. The semiconductor memory device as recited in claim 11, wherein the reservoir capacitor controller includes:
a control signal generator for generating a predetermined control signal; and
a switching unit for selectively connecting the first reservoir capacitor to the first power voltage line or the second power voltage line in response to the predetermined control signal.

13. The semiconductor memory device as recited in claim 12, wherein the switching unit includes:
a first switch for connecting the first reservoir capacitor to the first power voltage supply line when the predetermined control signal is activated; and
a second switch for connecting the first reservoir capacitor to the second power voltage line when the predetermined control signal is deactivated.

14. The semiconductor memory device as recited in claim 12, wherein the reservoir capacitor controller further includes an inverter for inverting the predetermined control signal.

15. A power voltage supplier of a semiconductor memory device, comprising:
a first power voltage supply line for supplying a first power voltage;
a second power voltage supply line for supplying a second power voltage;
a first reservoir capacitor for supplying the first and the second power voltages stably; and
a reservoir capacitor controller for selectively connecting the first reservoir capacitor either to the first power voltage supply line or the second power voltage supply line,
wherein the reservoir capacitor controller connects the first reservoir capacitor to the first power voltage supply line when the first power voltage is consumed without the second power voltage being consumed, and connects the first reservoir capacitor to the second power voltage supply line when the second power voltage is consumed.

16. The power voltage supplier as recited in claim 15, wherein the reservoir capacitor controller includes:
a control signal generator for generating a predetermined control signal; and
a switching unit for selectively connecting the first reservoir capacitor to the first power voltage line or the second power voltage line in response to the predetermined control signal.

17. The power voltage supplier as recited in claim 16, wherein the switching unit includes:
a first switch for connecting the first reservoir capacitor to the first power voltage supply line when the predetermined control signal is activated; and
a second switch for connecting the first reservoir capacitor to the second power voltage line when the predetermined control signal is deactivated.

18. The power voltage supplier as recited in claim 17, wherein the reservoir capacitor controller further includes an inverter for inverting the predetermined control signal.

19. The power voltage supplier as recited in claim 15, wherein the first voltage is lower than the second voltage.

20. The power voltage supplier as recited in claim 19, wherein the first voltage is a VDD voltage and the second voltage is a VPP voltage.

21. The power voltage supplier as recited in claim, 15, further comprising a second reservoir capacitor for maintaining a voltage level of the first power voltage stably, which is connected to the first power voltage supply line.

* * * * *